(12) United States Patent
Lim (10) Patent No.: US 7,019,571 B2
(45) Date of Patent: Mar. 28, 2006

(54) FREQUENCY SYNTHESIZER FOR A WIRELESS COMMUNICATION SYSTEM

(75) Inventor: Lysander Lim, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 25 days.

(21) Appl. No.: 10/814,026

(22) Filed: Mar. 31, 2004

(65) Prior Publication Data
US 2005/0218998 A1 Oct. 6, 2005

(51) Int. Cl.
*H03L 7/06* (2006.01)
(52) U.S. Cl. .................. 327/157; 327/148; 327/156; 331/17; 331/16
(58) Field of Classification Search ........ 327/156–158, 327/147–148; 331/10, 17, 16
See application file for complete search history.

(56) References Cited

U.S. PATENT DOCUMENTS

| | | | | |
|---|---|---|---|---|
| 5,740,213 | A | * | 4/1998 | Dreyer ..................... 375/374 |
| 5,821,789 | A | * | 10/1998 | Lee ........................... 327/156 |
| 6,075,406 | A | * | 6/2000 | Lee et al. ................. 327/538 |
| 6,137,372 | A | | 10/2000 | Welland |
| 6,147,567 | A | | 11/2000 | Welland et al. |
| 6,150,891 | A | | 11/2000 | Welland et al. |
| 6,167,245 | A | | 12/2000 | Welland et al. |
| 6,226,506 | B1 | | 5/2001 | Welland et al. |
| 6,233,441 | B1 | | 5/2001 | Welland |
| 6,304,146 | B1 | | 10/2001 | Welland |
| 6,308,055 | B1 | | 10/2001 | Welland et al. |
| 6,311,050 | B1 | | 10/2001 | Welland et al. |
| 6,317,006 | B1 | | 11/2001 | Welland et al. |
| 6,320,435 | B1 | * | 11/2001 | Tanimoto .................. 327/156 |
| 6,323,735 | B1 | | 11/2001 | Welland et al. |
| 6,327,463 | B1 | | 12/2001 | Welland |
| 6,329,882 | B1 | * | 12/2001 | Fayneh et al. ............. 331/10 |
| 6,388,536 | B1 | | 5/2002 | Welland |
| 6,483,390 | B1 | | 11/2002 | Welland |
| 6,531,913 | B1 | * | 3/2003 | Ross ......................... 327/536 |
| 6,549,764 | B1 | | 4/2003 | Welland |

(Continued)

OTHER PUBLICATIONS

Abramovitch, Danny, "Phase-Locked Loops: A Control Centric Tutorial", (May 8, 2002), pp. 1-50, Agilent Laboratories, Communications and Optics Research Lab.

(Continued)

*Primary Examiner*—Dinh T. Le
(74) *Attorney, Agent, or Firm*—Mark P. Kahler (57) ABSTRACT

A dual path frequency synthesizer is disclosed which includes a controlled oscillator and a phase detector that determines the phase difference between an output signal of the controlled oscillator and a reference signal. The synthesizer also includes a charge pump that is coupled to the phase detector. The synthesizer includes a direct path loop filter which is coupled to a charge pump output. The synthesizer also includes an integrating path loop filter which is coupled to another charge pump output and which has substantially the same topology as the direct path loop filter. The direct path loop filter and the integrating path loop filter are substantially matched with one another. The charge pump pumps charge into the direct and integrating path loop filters in response to the phase difference between the reference signal and the output signal of the controlled oscillator as determined by the phase detector. The controlled oscillator is effectively decoupled from the direct and integrating path loop filters at those times when the charge pump is pumping charge into the filters. This reduces the impact of signals from the charge pump that might otherwise cause degradation in the performance of the controlled oscillator and spurious radiation.

39 Claims, 4 Drawing Sheets

U.S. PATENT DOCUMENTS

| | | | |
|---|---|---|---|
| 6,549,765 | B1 | 4/2003 | Welland et al. |
| 6,574,288 | B1 | 6/2003 | Welland et al. |
| 6,580,376 | B1 | 6/2003 | Perrott |
| 6,590,426 | B1 | 7/2003 | Perrott |
| 6,611,160 | B1 * | 8/2003 | Lee et al. .................. 327/157 |
| 6,630,868 | B1 | 10/2003 | Perrott et al. |
| 6,781,424 | B1 * | 8/2004 | Lee et al. .................. 327/113 |
| 6,819,197 | B1 * | 11/2004 | Maldonado .............. 333/17.1 |
| 2002/0008585 | A1 | 1/2002 | Welland |
| 2002/0009984 | A1 | 1/2002 | Welland et al. |
| 2002/0033714 | A1 | 3/2002 | Perrott |
| 2002/0034932 | A1 | 3/2002 | Welland |
| 2002/0041216 | A1 | 4/2002 | Welland et al. |
| 2002/0089356 | A1 | 7/2002 | Perrott et al. |
| 2003/0119467 | A1 | 6/2003 | Welland et al. |

OTHER PUBLICATIONS

Alfke, Peter, "Frequency/Phase Comparator for Phase-Locked Loops", Application Note, (Dec. 2, 1996), pp. 1-2, Version 1.1, Xilinx, Inc.

Analog Devices, Inc., "A Technical Tutorial on Digital Signal Synthesis", (1999), pp. 1-122.

Anadigm, Inc., "Understanding Switched Capacitor Basics", Anadigmvortex Technical Training, (Nov. 2002), pp. 1-25.

Craninckx, et al., "A Fully Integrated CMOS DCS-1800 Frequency Synthesizer", (1998), pp. 1-10, Institute of Electrical and Electronics Engineers, Inc.

Curtin, et al., "Phase-Locked Loops for High-Frequency Receivers and Transmitters—Part 1", (1999), pp. 1-4, 33-3, Analog Devices, Inc.

Curtin, et al., "Phase-Locked Loops for High-Frequency Receivers and Transmitters—Part 2", (1999), pp. 1-5, 33-5, Analog Devices, Inc.

Curtin, et al., "Phase-Locked Loops for High-Frequency Receivers and Transmitters—Part 3", (1999), pp. 1-5, 33-7, Analog Devices, Inc.

De Muer, et al., "A 1.8 GHz CMOS $\delta\sigma$ Fractional-N Synthesizer", (2001), Department of Electrical Engineering (ESAT)—MICAS, Katholieke Universiteit Leuven.

De Muer, Bram, "Monolithic CMOS Fractional- N Synthesizer", (Nov. 2002), pp. 142-144, Katholieke Universiteit Leuven.

Forster, Edward, "The Phase/Frequency Comparator Simplified", (1997).

Herzel, et al., "An Integrated CMOS RF Synthesizer for 802.11a Wireless LAN", IEEE Journal of Solid-State Circuits, (Oct. 2003), pp. 1767-1770, vol. 38, No. 10, Institute of Electrical and Electronics Engineers, Inc.

James, Norman, "CycleSim: A Phase-Locked Loop Simulator", (Nov. 1999), Embedded Systems.

Koo, et al., "A Fully-Integrated CMOS Frequency Synthesizer with Charge-Averaging Charge Pump and Dual-Path Loop Filter for PCS- and Cellular-CDMA Wireless Systems", IEEE Journal of Solid-State Circuits, (May 2002), pp. 536-542, vol.: 37, No. 5, (Abstract only), Institute of Electrical and Electronics Engineers, Inc.

Lacanette, Kerry, "A Basic Introduction to Filters—Active, Passive, and Switched-Capacitor", National Semiconductor Application Note, (Apr. 1991), pp. 1-22, National Semiconductor Corporation.

Martin, Ken, "Phase-Locked Loops", (2004), pp. 1-55, Department of Electrical and Computer Engineering, University of Toronto.

LeCroy Corporation, "Phase Locked Loop Basics: An Introduction to Phase Locked Loops", (2004), LeCroy Applications Brief No. L.A.B. 1007.

Maxim Integrated Products, Inc., Charge Pumps Shine in Portable Designs, Application Note 669, (Mar. 15, 2001), pp. 1-15.

Mini-Circuits, "Phase Locked Loop Fundamentals", (1999).

Nash, Garth, "Phase-Locked Loop Design Fundamentals", Application Note, (1994), pp. 1-12, Motorola, Inc.

Philips Semiconductor, "An Overview of the Phase-Locked Loop (PLL)", Application Note AN177, (Dec. 1988), pp. 1-6.

Sinha, Saurabh "Design of an Integrated CMOS PLL Frequency Synthesizer", (2002) Signal Processing Systems, Department of Electrical Engineering, Technische Universiteit Eindhoven.

University of Seoul, "Discrete-Time Filter (Switched-Capacitor Filter)", (1996-2000), IC Lab, Institute of Electrical and Electronics Engineers, Inc.

* cited by examiner

FREQUENCY SYNTHESIZER FOR A WIRELESS COMMUNICATION SYSTEM

TECHNICAL FIELD OF THE INVENTION

The disclosures herein relate generally to frequency synthesis and more particularly to the synthesis of high frequency signals useful in wireless communication devices.

BACKGROUND

Wireless communication systems typically employ frequency synthesizer technology in both the receive path circuitry and the transmit path circuitry. One significant application for frequency synthesizers is in mobile phone systems which transmit and receive on many different frequency channels. For example, the United States and Europe have adopted mobile phone standards with communication centered in two frequency bands at about 900 MHz and 2300 MHz. Each of these bands has a large number of dedicated transmit frequency channels and receive frequency channels. A frequency synthesizer enables a wireless unit to tune among the many channels of such bands as needed.

Frequency synthesizers typically employ a phase locked-loop (PLL) together with divider and phase detector circuitry to enable a wireless unit to switch from channel to channel. PLL circuits include voltage controlled oscillators (VCOs) which are controlled via feedback and an error signal to produce the desired output frequency ($f_{out}$). In more detail, the output frequency ($f_{out}$) may be made programmable by utilizing an output feedback divider ($\div N$) and a reference divider ($\div R$) for an input reference frequency ($f_{ref}$). The output frequency produced is a function of the values selected for "N" and "R" in the divider circuits, such that ($f_{out}$)=N($f_{ref}$/R). The PLL circuitry typically utilizes a phase detector to monitor phase differences ($\Delta\phi$) between the divided reference frequency ($f_{ref}$/R) and the divided output frequency ($f_{out}$/N) to drive a charge pump. The charge pump delivers packets of charge proportional to the phase difference ($\Delta\phi$) to a loop filter. The loop filter outputs a voltage that is connected to the VCO to control its output frequency. The feedback loop thus formed attempts to drive the phase difference ($\Delta\phi$, which acts as an error signal) to zero (or at least to a constant value) in order to provide a stable and programmable output frequency ($f_{out}$).

The frequency synthesizer described above employs a single path PLL. Frequency synthesizers are also available which employ two PLL paths, namely dual path PLL frequency synthesizers. In that approach the PLL includes a direct path loop filter and an integrating path loop filter which operate in continuous time. Unfortunately, the direct and integrating paths employed in this dual path, continuous time PLL approach tend to be difficult to match. One cause of this difficulty is that each of the dual paths can exhibit a different amount of temperature drift. Moreover, dual path PLLs are unfortunately prone to spurious outputs.

What is needed is a frequency synthesizer that overcomes the above described problems.

SUMMARY

Accordingly, in one embodiment, a method is disclosed for operating a frequency synthesizer. The method includes detecting a phase difference between an output signal of a controlled oscillator and a reference signal. The method also includes pumping charge, in response to the phase difference, into a direct path loop filter. The method further includes pumping charge, in response to the phase difference, into an integrating path loop filter having substantially the same topology as the direct path loop filter. The method still further includes providing a signal from the direct path loop filter and the integrating path loop filter to the controlled oscillator to control the frequency and phase of the output signal of the controlled oscillator.

In another embodiment, a frequency synthesizer is disclosed including a controlled oscillator and a phase detector that detects a phase difference between an output signal of the controlled oscillator and a reference signal. The frequency synthesizer also includes a charge pump, coupled to the phase detector, that pumps charge at charge pump outputs. The frequency synthesizer further includes a direct path loop filter that is coupled to one of the charge pump outputs and the controlled oscillator. The frequency synthesizer still further includes an integrating path loop filter that is coupled to another charge pump output and the controlled oscillator. The integrating path loop filter has substantially the same topology as the direct path loop filter. The direct path loop filter and the integrating path loop filter provide a signal to the controlled oscillator to control the frequency and phase of the output signal of the controlled oscillator.

In yet another embodiment, a frequency synthesizer integrated circuit (IC) device is disclosed which includes at least one variable frequency output. The IC includes a substrate on which components of the IC are situated. The IC also includes a controlled oscillator and a phase detector that detects a phase difference between an output signal of the controlled oscillator and a reference signal. The IC further includes a charge pump, coupled to the phase detector, that pumps charge at charge pump outputs. The IC still further includes a direct path loop filter that is coupled to one of the charge pump outputs and the controlled oscillator. The IC also includes an integrating path loop filter that is coupled to another charge pump output and the controlled oscillator. The integrating path loop filter has substantially the same topology as the direct path loop filter. The direct path loop filter and the integrating path loop filter provide a signal to the controlled oscillator to control the frequency and phase of the output signal of the controlled oscillator.

BRIEF DESCRIPTION OF THE DRAWINGS

The appended drawings illustrate only exemplary embodiments of the invention and therefore do not limit its scope, because the inventive concepts lend themselves to other equally effective embodiments.

DETAILED DESCRIPTION

Figure 1:
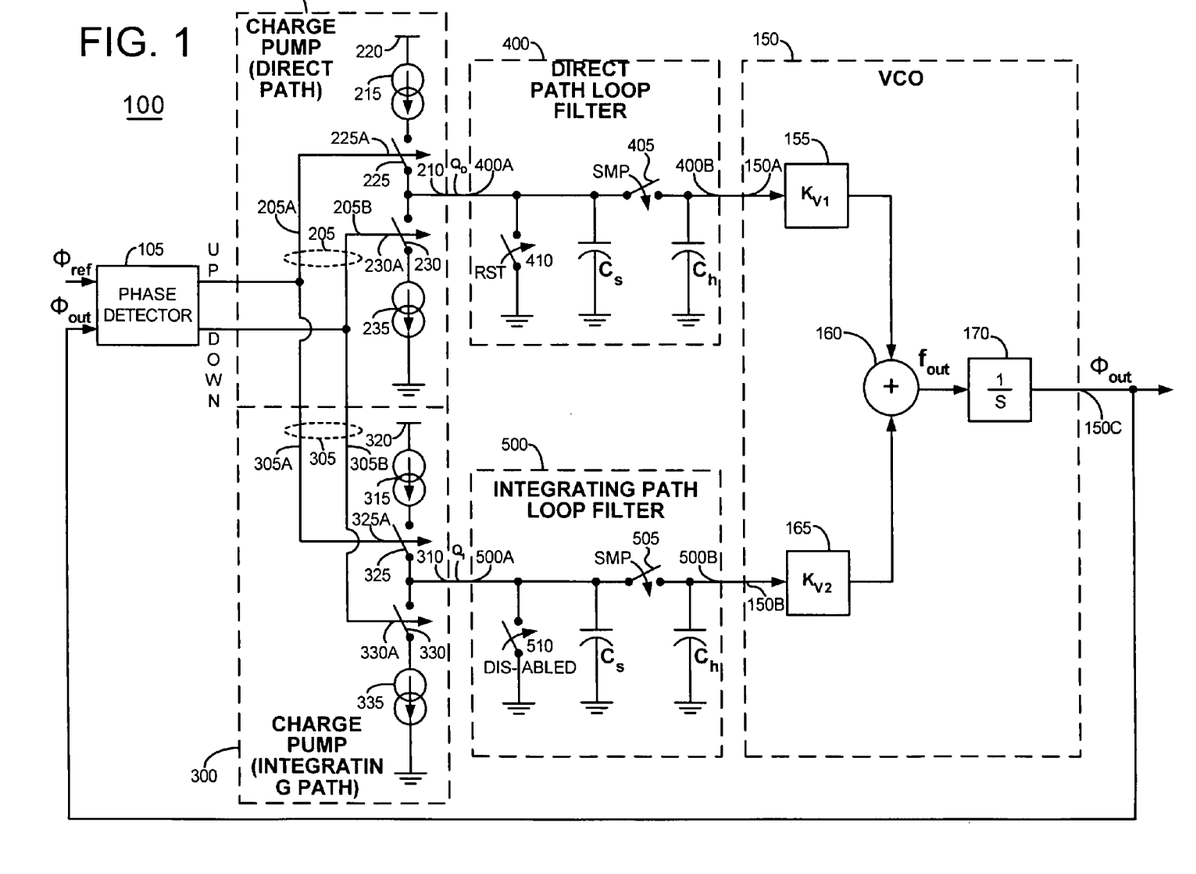
FIG. 1 is a schematic diagram of one embodiment of the disclosed frequency synthesizer.

FIG. 1 is a schematic diagram of one embodiment of the disclosed dual path frequency synthesizer 100. Synthesizer 100 is initially discussed at a high level which is followed by a more detailed discussion of its structure and operation. Synthesizer 100 includes a two input phase detector 105 to which a phase reference signal, $\phi_{ref}$, is supplied at a $\phi_{ref}$ input. A phase output signal, $\phi_{out}$, from voltage controlled oscillator (VCO) 150 is fed back to the remaining input of phase detector 105. Phase detector 105 includes UP and DOWN outputs as shown. The UP and DOWN outputs of phase detector 105 are coupled to input 205 of direct path charge pump 200. The UP and DOWN outputs of phase detector 105 are also coupled to input 305 of integrating path charge pump 301.

Direct path charge pump 200 includes an output 210 which is coupled to input 400A of direct path loop filter 400 so that loop filter 400 receives a charge $Q_D$ from charge pump 200. Direct path loop filter 400 is a switched capacitor type filter having an output 400B. Synthesizer 100 includes a voltage controlled oscillator 150 having an input 150A which is coupled to output 400B of direct path loop filter 400. Charge pump 200 and loop filter 400 together form a "direct path" between phase detector 105 and VCO 150. VCO 150 includes an output 150C which is coupled to the $\phi_{out}$ input of phase detector 105 such that the $\phi_{out}$ signal is fed back thereto.

Integrating path charge pump 300 includes an output 310 which is coupled to input 500A of an integrating path loop filter 500 so that loop filter 500 receives a charge $Q_I$ from charge pump 300. Integrating path loop filter 500 is a switched capacitor type filter having an output 500B which is coupled to input 150B of voltage controlled oscillator 150. Charge pump 300 and loop filter 500 together form an "integrating path" between phase detector 105 and VCO 150. As will be discussed below, the topology of integrating path loop filter 500 substantially matches the topology of direct path loop filter 400.

More detail is now provided with respect to the structures forming synthesizer 100 and the operation of those structures. When the phase output signal, $\phi_{out}$, is leading the phase reference signal, $\phi_{ref}$, phase detector 105 generates a DOWN signal with a logic high at its DOWN output. Conversely, when the phase output signal, $\phi_{out}$, is lagging the phase reference signal, $\phi_{ref}$, detector 105 generates an UP signal with a logic high at its UP output. The phase detector UP output is connected to input 205A of direct path charge pump 200 as shown. The phase detector DOWN output is connected to input 205B of direct path charge pump 200 as shown. When the UP signal exhibits a logic high, the DOWN signal exhibits a logic low, and vice versa.

Direct path charge pump 200 includes a current source 215 coupled to a voltage rail 220. Current source 215 is coupled to charge pump output 210 via switch 225 as shown. Charge pump output 210 is also coupled to ground via switch 230 and current source 235 as shown. The UP output of phase detector 105 is coupled to a control input 225A of switch 225. When switch 225 is closed at the direction of the UP signal from phase detector 105, current source 215 pumps up the input 400A of direct path loop filter 400 with charge, $Q_D$. Conversely, when switch 230 is closed at the direction the DOWN signal from phase detector 105, current source 235 pulls current away from input 400A of the direct path loop filter 400 and thus pumps input 400A down. It is noted that when switch 225 is closed to pump up loop filter 400, switch 230 is open. Conversely, when switch 230 is closed to pump down loop filter 400, switch 225 is open.

Integrating path charge pump 300 exhibits substantially the same circuit topology as direct path charge pump 200 in one embodiment of the disclosed frequency synthesizer. Thus, integrating path charge pump 300 is substantially matched with direct path charge pump 200. The UP output of phase detector 105 is connected to input 305A of integrating path charge pump 300. The DOWN output of the phase detector is connected to input 305B of integrating path charge pump 300. Integrating path charge pump 300 includes a current source 315 coupled to a voltage rail 320. Current source 315 is coupled to charge pump output 310 via switch 325 as shown. Charge pump output 310 is also coupled to ground via switch 330 and current source 335 as shown. The UP output of phase detector 105 is coupled to a control input 325A of switch 225. When switch 325 is closed at the direction of the UP signal from phase detector 105, current source 315 pumps up the input 500A of integrating path loop filter 500 with charge, $Q_I$. Conversely, when switch 330 is closed at the direction of the DOWN signal from phase detector 105, current source 335 pulls current away from input 500A of direct path loop filter 400 and thus pumps input 500A down. It is noted that when switch 325 is closed to pump up loop filter 500, switch 330 is open. Conversely, when switch 330 is closed to pump down loop filter 500, switch 325 is open.

Direct path charge pump 200 supplies charge $Q_D$ to direct path loop filter 400. Integrating path charge pump 301 supplies charge $Q_I$ to integrating path loop filter 500. In one embodiment, direct path loop filter 400 is a switched capacitor filter. For example, filter 400 can be a resistor capacitor (RC) switched capacitor filter including a switched capacitor resistor $C_s$ (sample) and a capacitor $C_h$ (hold) as shown. Switched capacitor resistor $C_s$ is coupled between filter input 400A and ground. Capacitor $C_h$ is coupled between loop filter output 400B and ground. A sampling switch 405 is coupled between switched capacitor resistor $C_s$ and capacitor $C_h$ to periodically provide charge to capacitor $C_h$ at times determined by sampling signal SMP shown in FIG. 2A. After a charge pulse is provided to capacitor $C_h$ by virtue of switch 405 being closed for an SMP pulse, switch 405 is opened and reset switch 410 is closed to reset the charge on capacitor $C_s$ to zero or a relatively low value. Reset switch 410 is periodically closed as directed by the reset control signal (RST) which is supplied to switch 410. A representative waveform for the RST reset control signal is shown in FIG. 2B.

Integrating path charge pump 300 supplies charge to integrating path loop filter 500. Integrating path loop filter 500 has substantially the same topology as direct path loop filter 400. For example, loop filter 500 includes a switched capacitor resistor $C_s$ and a capacitor $C_h$ in the same configuration as loop filter 400. Loop filter 500 also includes switches 505 and 510 which correspond to switches 405 and 410 of loop filter 400. However, in loop filter 500 the switch 510 is disabled, For example, the control input of switch 510 is coupled to ground so that switch 510 will remain open and not be switched across switched capacitor resistor $C_s$. Alternatively, switch 510 is not clocked, i.e. the RST signal is prevented from reaching the control input of switch 510. As mentioned above, charge pump 500 provides charge to integrating path loop filter 500. The SMP sample control signal provided to switch 505 causes switch 505 to periodically sample this charge and provide it to capacitor $C_h$ where it builds up over time. Integrating path loop filter 500 thus behaves as in integrator.

In comparing direct path loop filter 400 with integrating path loop filter 500, it is seen that the topology of these loop filters is component for component substantially the same. It is noted that disabled switch 510 in integrating path loop filter 500 corresponds to active switch 410 in direct path loop filter 400. Switch 510 is kept in integrating path filter 500 to preserve the topology match between the two filters.

Charge pump 200 and loop filter 400 together form the "direct path" of frequency synthesizer 100. Charge pump 300 and loop filter 500 together form the "integrating path" of synthesizer 100. The direct path and the integrating path each supply filtered signals to VCO 150. The filtered signal from direct path loop filter 400 is gained up by a constant $K_{V1}$ through gain block 155 which is coupled to an input of differentiator, summer or combiner 160. The filtered signal from integrating path loop filter 500 is gained up by a constant $K_{V2}$ through gain block 165 which is coupled to another input of combiner 160. The output of combiner 160 is a signal exhibiting a frequency $f_{out}$ which is supplied to integrator 170. Integrator 170 converts the $f_{out}$ signal to a phase signal $\phi_{out}$. This phase signal $\phi_{out}$ is fed back to phase detector 105 as shown. The phase lock loop action of frequency synthesizer 100 causes the $\phi_{out}$ signal to exhibit the same phase as the $\phi_{ref}$ signal once loop lock is achieved.

Figure 2A:
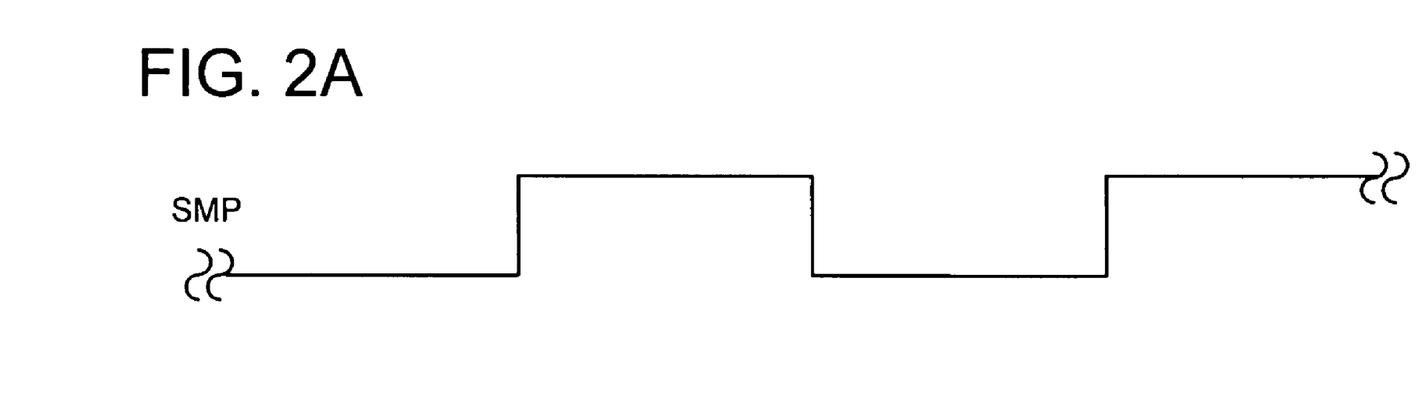
FIG. 2A is a timing diagram for the sample signal, SMP, employed in the frequency synthesizer of FIG. 1.
Figure 2B:
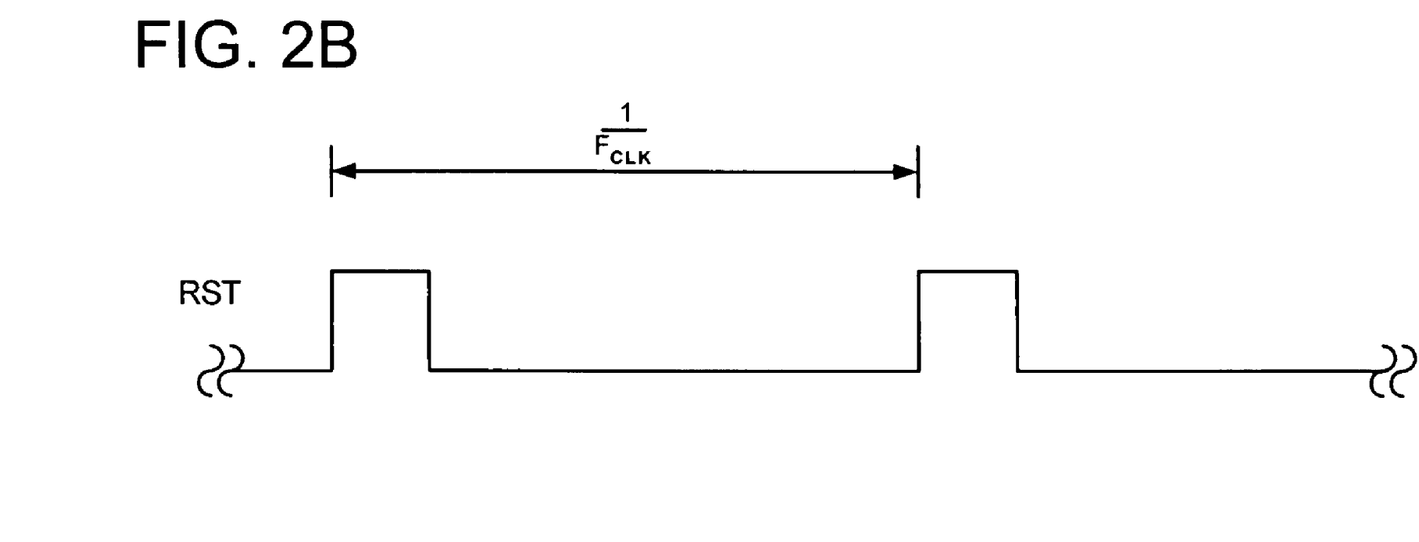
FIG. 2B is a timing diagram for the reset signal, RST, employed in the frequency synthesizer of FIG. 1.

In the embodiment discussed above, synthesizer 100 is configured such that charge pumps 200 and 300 deliver charge Q in between the RST and SMP pulses seen in FIGS. 2A and 2B. Thus, signal abnormalities or glitches associated with charge pump updates are shielded from the input of VCO 150. This occurs because the signal path to the VCO is effectively disconnected at a time when spurs might be generated by the charge pump. Spurious radiation is thus significantly reduced.

Figure 3:
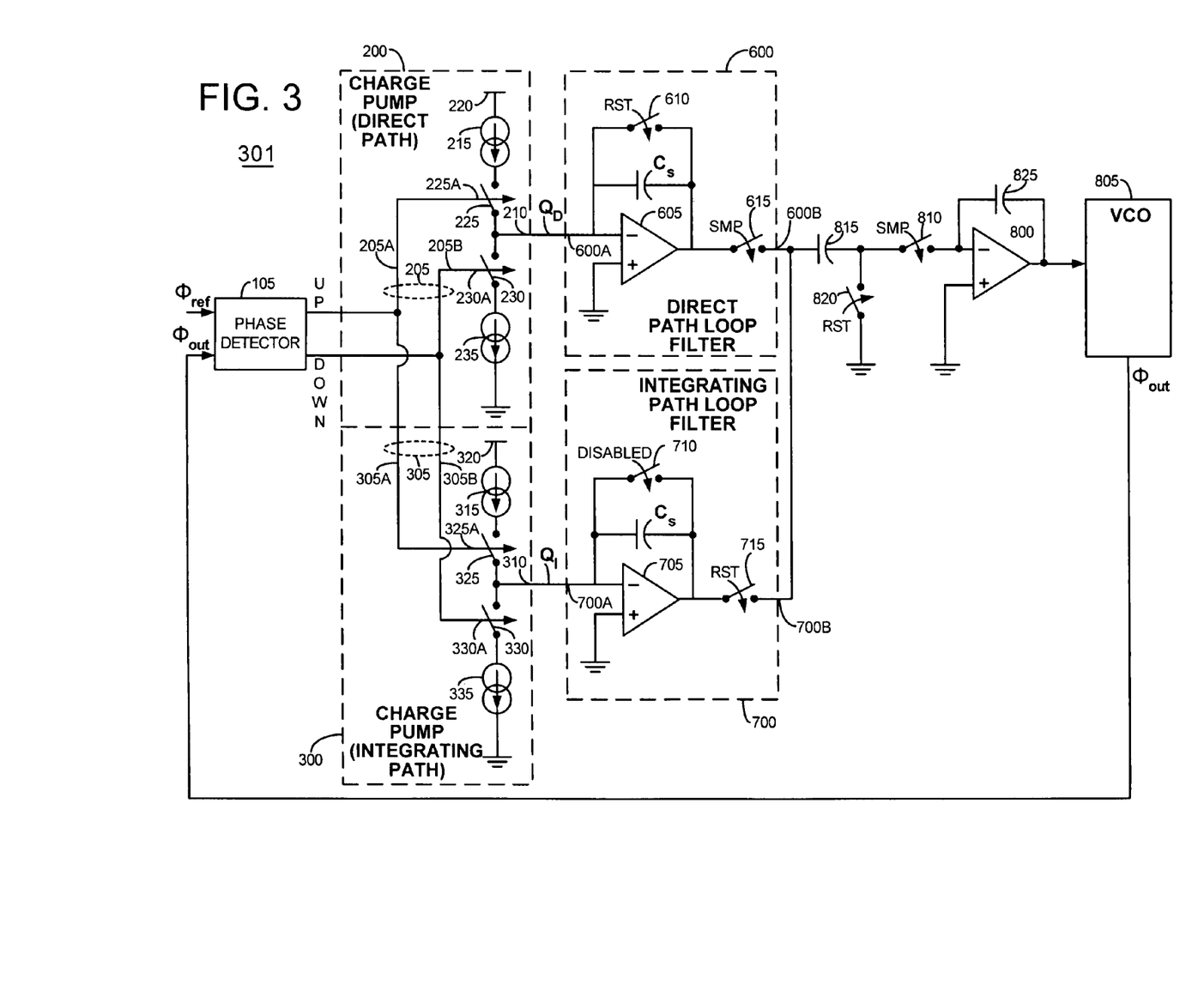
FIG. 3 is a schematic diagram of another embodiment of the disclosed frequency synthesizer.

FIG. 3 is a schematic diagram of a frequency synthesizer 301 which is another embodiment of the disclosed synthesizer technology. Frequency synthesizer 301 includes several elements in common with synthesizer 100 of FIG. 1. Like numbers are used to indicate like elements in FIGS. 1 and 3. Synthesizer 301 includes a direct path loop filter 600 and an integrating path loop filter 700. Direct path loop filter 600 employs a switched capacitor filter to achieve filtering. Direct path loop filter input 600A is coupled to charge pump output 210 to receive the charge $Q_D$ therefrom. Direct path loop filter 600 includes an amplifier 605, the inverting input of which is coupled to charge pump output 210 to receive the $Q_D$ charge. The non-inverting input of amplifier 605 is coupled to ground. Capacitor $C_S$ and switch 610 are parallel-connected across the output of amplifier 605 and the inverting input of amplifier 605. The output of amplifier 605 is coupled via switch 615 to filter output 600B. Direct path loop filter output 600B is coupled to output 700B of integrating path loop filter 700 as shown.

Integrating path loop filter 700 includes an input 700A which is coupled to output 310 of charge pump 300 to receive the charge $Q_I$ therefrom. The topology of integrating path loop filter 700 substantially matches the topology of direct path loop filter 600. In more detail, integrating path loop filter includes an amplifier 705, the inverting input of which is coupled to charge pump output 310 to receive the $Q_I$ charge. The non-inverting input of amplifier 705 is coupled to ground. Capacitor $C_S$ and switch 710 are parallel-connected across the output of amplifier 705 and the inverting input of amplifier 705. The output of amplifier 705 is coupled by switch 715 to filter output 700B. In this embodiment, the topology of the direct and integrating path loop filters is the same except that switch 710 of integrating path loop filter 700 is always off or disabled thus leaving switch 710 open. It is noted that keeping switch 710, although disabled, in integrating path loop filter 700 permits filter 700 to be substantially matched with filter 600. With switch 710 disabled, loop filter 700 acts as an integrator.

An amplifier 800 is used to combine the outputs of the direct and integrating paths and to provide a high-pole filter to further attenuate any high frequency energies which might otherwise reach VCO 805. More specifically, the inverting input of amplifier 800 is coupled by via switch 810 and capacitor 815 to filter outputs 600B and 700B. A switch 820 is coupled between ground and the junction of capacitor 815 and switch 810 to enable discharge of capacitor 815 to ground under the control of the reset signal, RST. Switch 810 enables sampling of the loop filter signals from capacitor 815 under the control of sampling signal, SMP. A capacitor 825 is coupled between the inverting input of amplifier 800 and the output of amplifier 800. The non-inverting input of amplifier 800 is coupled to ground. The output of amplifier 800 is coupled to the input of VCO 805 to instruct VCO 805 regarding the phase of the output signal $\phi_{out}$ which the VCO should generate by phase lock loop action.

Figure 4:
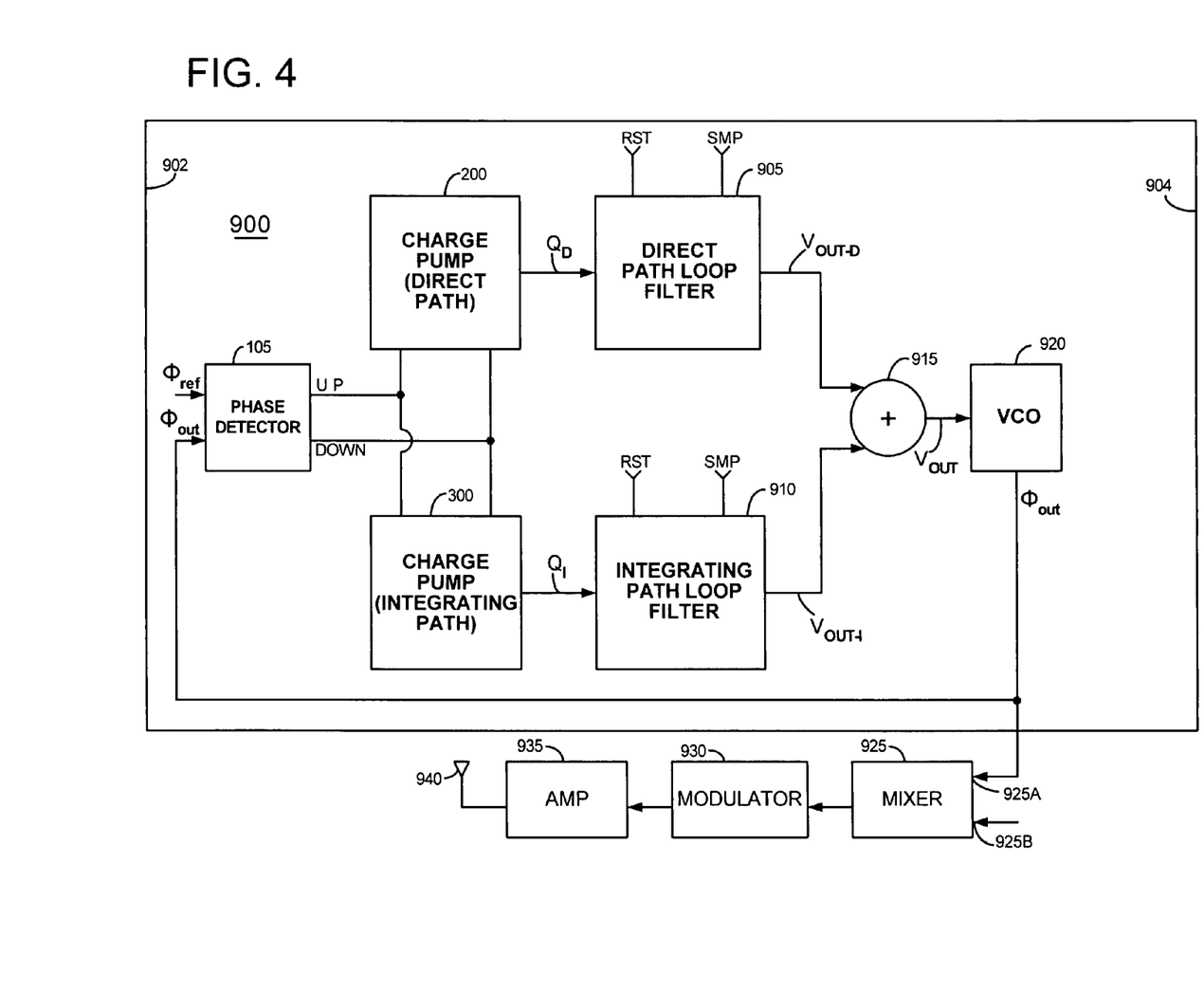
FIG. 4 is a block diagram of the disclosed frequency synthesizer.

FIG. 4 is a high level block diagram of a frequency synthesizer 900 fabricated on an integrated circuit (IC) chip 902 including a substrate 904. Synthesizer 900 includes circuitry in common with synthesizer 100 of FIG. 1 and synthesizer 301 of FIG. 3. Like numbers are used to identify like components. Phase detector 105 includes UP and DOWN outputs which are coupled to direct path charge pump 200 and integrating path charge pump 300. UP and DOWN signals are generated by phase detector 105 depending on which of its inputs arrive first, namely $\phi_{out}$ or $\phi_{ref}$. If the VCO phase $\phi_{out}$ signal is lagging the reference phase $\phi_{ref}$, then the frequency of VCO 920 is too low. In this instance, phase detector 105 generates an UP signal which is fed to both direct path charge pump 200 and integrating path charge pump 300. Charge pumps 200 and 300 generate charges $Q_D$ and $Q_I$, respectively, which are filtered by loop filters 905 and 910, respectively. The resultant $V_{OUT-D}$ and $V_{OUT-I}$ filtered signals are combined by combiner 915 and used to drive VCO 920 to a higher frequency until the phase of the $\phi_{out}$ signal is equal to the phase of the $\phi_{ref}$ signal.

On the other hand, if phase detector 105 determines that the VCO phase $\phi_{out}$ signal is leading the reference phase $\phi_{ref}$, then the frequency of VCO 920 is too high. In this instance, phase detector 105 generates a DOWN signal which is fed to both direct path charge pump 200 and integrating path charge pump 300. Charge pumps 200 and 300 generate charges $Q_D$ and $Q_I$, respectively, which are filtered by loop filters 905 and 910, respectively. The resultant $V_{OUT-D}$ and $V_{OUT-I}$ filtered signals are combined by combiner 915 and used to drive VCO 920 to a lower frequency until the phase of the $\phi_{out}$ signal is equal to the phase of the $\phi_{ref}$ signal.

Direct path loop filter 905 and integrated path loop filter 910 each have switched capacitor filter topologies, examples of which were given above in the discussion of FIG. 1 and FIG. 3. A sample signal SMP and a reset signal RST are supplied to switches associated with direct path loop filter 905 as discussed above. Sample signal SMP and reset signal RST are also supplied to switches associated with integrating path loop filter 910 as discussion above. Details of the routing of signals SMP and RST to switching components in the switched capacitor filters vary depending upon the particular filter topology as discussed above with reference to FIGS. 1 and 3. In one embodiment, charges $Q_D$ and $Q_I$ are delivered to loop filters 905 and 910, respectively, during times when the SMP signal causes the output of the loop filters to be effectively disconnected from the inputs of the loop filters. Synthesizer 900 is configured such that, when SMP causes a charge sample to be taken, charges $Q_D$ and $Q_I$ from the charge pumps are ignored. This reduces the possibility of glitches associated with charge pumps 200 and 300 from reaching VCO 920 and degrading the VCO output.

The output of VCO 920 is coupled to the input 925A of a mixer 925. Mixer 925 mixes the VCO output signal with an input signal supplied to mixer input 925B. The output of mixer 925 is coupled to the input of a modulator 930 so that the mixer output signal is modulated with information that is to be transmitted. The resultant modulated signal is provided to amplifier 935 which transmits the modulated signal via antenna 940 after amplification. In this example, the frequency synthesizer is used in a wireless communication system to facilitate the transmission of information. It will be appreciated that the disclosed synthesizer can also be used to facilitate the reception of radio frequency signals.

It is noted that charge pump 200 operates together with loop filter 905 to form a direct path between phase detector 105 and VCO 920. Charge pump 300 operates together with loop filter 910 to form an integrating path between phase detector 105 and VCO 920.

A frequency synthesizer is thus disclosed which achieves matching between the direct path and the integrating path. With such an arrangement, variations in the settling speed of the phase locked loop of the synthesizer are relatively small. Advantageously, in one embodiment, the charge pump updates switched capacitor loop filter circuitry when the SMP sample signal is off, thus effectively disconnecting the signal path to the VCO. The charge pump delivers charge in between the RST and SMP pulses. This arrangement advantageously inhibits the glitches associated with charge pump updates from reaching and degrading the VCO output. Spurious radiation is thus significantly reduced. It is noted that in actual practice, dividers may be used in the reference signal and feedback signal paths to tune the VCO to the desired operating frequency.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of operating a frequency synthesizer, comprising:
    detecting a phase difference between an output signal of a controlled oscillator and a reference signal, the output signal exhibiting a frequency and phase;
    pumping first charge, in response to the phase difference, into a first filter which is configured as a direct path loop filter;
    pumping second charge, in response to the phase difference, into a second filter having substantially the same topology as the first filter, the second filter being configured as an integrating path loop filter;
    providing a signal from the first and second filters to the controlled oscillator to control the frequency and phase of the output signal of the controlled oscillator; and
    decoupling the controlled oscillator from the first filter while first charge is pumped into the first filter.

2. The method of claim 1 further comprising decoupling the controlled oscillator from the second filter while second charge is pumped into the second filter.

3. The method of claim 1 wherein the first filter is a switched capacitor filter.

4. The method of claim 1 wherein the second filter is a switched capacitor filter.

5. The method of claim 4 wherein the switched capacitor filter includes a disabled switched capacitor.

6. The method of claim 1 wherein the first filter and the second filter are substantially matched with one another.

7. The method of claim 1 further comprising combining, within the controlled oscillator, an output signal of the first filter with an output signal of the second filter.

8. The method of claim 1 further comprising combining, external to the controlled oscillator, an output signal of the first filter with an output signal of the second filter.

9. The method of claim 1 wherein the controlled oscillator is a voltage controlled oscillator.

10. A frequency synthesizer, comprising:
    a controlled oscillator;
    a phase detector that detects a phase difference between an output signal of the controlled oscillator and a reference signal, the output signal exhibiting a frequency and phase;
    a charge pump, coupled to the phase detector, that pumps first charge at a first charge pump output and second charge at a second charge pump output;
    a direct path loop filter, coupled to the first charge pump output and the controlled oscillator;
    an integrating path loop filter, coupled to the second charge pump output and the controlled oscillator, the integrating path loop filter having substantially the same topology as the direct path loop filter;
    the direct path loop filter and the integrating path loop filter providing a signal to the controlled oscillator to control the frequency and phase of the output signal of the controlled oscillator, the direct path loop filter including a first switch that decouples the direct path loop filter from the controlled oscillator while the charge pump pumps first charge into the direct path loop filter.

11. The frequency synthesizer of claim 10 wherein the integrating path loop filter includes a second switch that decouples the integrating path loop filter from the controlled oscillator while the charge pump pumps second charge into the integrating path loop filter.

12. The frequency synthesizer of claim 10 wherein the direct path loop filter is a switched capacitor filter.

13. The frequency synthesizer of claim 10 wherein the integrating path loop filter is a switched capacitor filter.

14. The frequency synthesizer of claim 13 wherein the switched capacitor filter includes a disabled switched capacitor.

15. The frequency synthesizer of claim 10 wherein the direct path loop filter and the integrating path loop filter are substantially matched with one another.

16. The frequency synthesizer of claim 10 wherein the controlled oscillator includes a combiner which combines signals from the direct path loop filter and the integrating path loop filter.

17. The frequency synthesizer of claim 10 further comprising a combiner external to the controlled oscillator which combines signals from the direct path loop filter and the integrating path loop filter.

18. The frequency synthesizer of claim 10 wherein the controlled oscillator is a voltage controlled oscillator.

19. A wireless communication system, comprising:
a frequency synthesizer including:
a controlled oscillator;
a phase detector that detects a phase difference between an output signal of the controlled oscillator and a reference signal, the output signal exhibiting a frequency and phase;
a charge pump, coupled to the phase detector, that pumps first charge at a first charge pump output and second charge at a second charge pump output;
a direct path loop filter, coupled to the first charge pump output and the controlled oscillator;
an integrating path loop filter, coupled to the second charge pump output and the controlled oscillator, the integrating path loop filter having substantially the same topology as the direct path loop filter;
the direct path loop filter and the integrating path loop filter providing a signal to the controlled oscillator to control the frequency and phase of the output signal of the controlled oscillator, the direct path loop filter including a first switch that decouples the direct path loop filter from the controlled oscillator while the charge pump pumps first charge into the direct path loop filter; and
a mixer circuit, coupled to the frequency synthesizer, to mix an input signal with the output signal of the controlled oscillator of the frequency synthesizer.

20. The wireless communication system of claim 19 wherein the integrating path loop filter includes a second switch that decouples the integrating path loop filter from the controlled oscillator while the charge pump pumps second charge into the integrating path loop filter.

21. The wireless communication system of claim 19 wherein the direct path loop filter is a switched capacitor filter.

22. The wireless communication system of claim 19 wherein the integrating path loop filter is a switched capacitor filter.

23. The wireless communication system of claim 22 wherein the switched capacitor filter includes a disabled switched capacitor.

24. The wireless communication system of claim 19 wherein the direct path loop filter and the integrating path loop filter are substantially matched with one another.

25. The wireless communication system of claim 19 wherein the controlled oscillator includes a combiner which combines signals from the direct path loop filter and the integrating path loop filter.

26. The wireless communication system of claim 19 further comprising a combiner external to the controlled oscillator which combines signals from the direct path loop filter and the integrating path loop filter.

27. The wireless communication system of claim 19 wherein the controlled oscillator is a voltage controlled oscillator.

28. A frequency synthesizer integrated circuit (IC) having at least one variable frequency output, comprising:
a controlled oscillator;
a phase detector that detects a phase difference between an output signal of the controlled oscillator and a reference signal, the output signal exhibiting a frequency and phase;
a charge pump, coupled to the phase detector, that pumps first charge at a first charge pump output and second charge at a second charge pump output;
a direct path loop filter, coupled to the first charge pump output and the controlled oscillator;
an integrating path loop filter, coupled to the second charge pump output and the controlled oscillator, the integrating path loop filter having substantially the same topology as the direct path loop filter;
the direct path loop filter and the integrating path loop filter providing a signal to the controlled oscillator to control the frequency and phase of the output signal of the controlled oscillator, the direct path loop filter including a first switch that decouples the direct path loop filter from the controlled oscillator while the charge pump pumps first charge into the direct Path loop filter; and
a substrate on which the controlled oscillator, phase detector, charge pump, direct path loop filter and integrating path loop filter are situated.

29. The frequency synthesizer integrated circuit (IC) of claim 28 wherein the integrating path loop filter includes a second switch that decouples the integrating path loop filter from the controlled oscillator while the charge pump pumps second charge into the integrating path loop filter.

30. The frequency synthesizer integrated circuit (IC) of claim 28 wherein the direct path loop filter is a switched capacitor filter.

31. The frequency synthesizer integrated circuit (IC) of claim 28 wherein the integrating path loop filter is a switched capacitor filter.

32. The frequency synthesizer integrated circuit (IC) of claim 31 wherein the switched capacitor filter includes a disabled switched capacitor.

33. The frequency synthesizer integrated circuit (IC) of claim 31 wherein the direct path loop filter and the integrating path loop filter are substantially matched with one another.

34. The frequency synthesizer integrated circuit (IC) of claim 31 wherein the controlled oscillator includes a combiner which combines signals from the direct path loop filter and the integrating path loop filter.

35. The frequency synthesizer integrated circuit (IC) of claim 31 further comprising a combiner external to the controlled oscillator which combines signals from the direct path loop filter and the integrating path loop filter.

36. The frequency synthesizer integrated circuit (IC) of claim 28 wherein the controlled oscillator is a voltage controlled oscillator.

37. A frequency synthesizer, comprising:
a phase detector, configured to detect a phase difference between first and second phase detector input signals;
a charge pump, coupled to the phase detector, the charge pump configured to supply first charge to a first charge pump output and second charge to a second charge pump output;
a direct path filter coupled to the first charge pump output, the direct path filter configured to filter the first charge to produce a first filtered signal;
an integrating path loop filter coupled to the second charge pump output, the integrating path loop filter configured to filter the second charge to produce a second filtered signal; and
a combiner coupled to the direct path loop filter and to the integrating path loop filter, the combiner configured to combine the first and second filtered signals, the direct path loop filter including a first switch that decouples the direct path loop filter from the combiner while the first charge pump output supplies the first charge to the direct path loop filter, the integrating path loop filter including a second switch that decouples the integrating path loop filter from the combiner while the second charge pump output supplies the second charge to the integrating path loop filter.

38. The frequency synthesizer of claim 37 further comprising a voltage controlled oscillator (VCO) coupled to the combiner, the VCO providing a VCO output signal.

39. The frequency synthesizer of claim 38 wherein the first phase detector input signal is a reference frequency signal and the second phase detector input signal is the VCO output signal.

* * * * *